US012604749B2

(12) United States Patent
Choi

(10) Patent No.: US 12,604,749 B2
(45) Date of Patent: Apr. 14, 2026

(54) SEMICONDUCTOR PACKAGE

(71) Applicant: SAMSUNG ELECTRONICS CO., LTD., Suwon-si (KR)

(72) Inventor: Kyuhyeon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 280 days.

(21) Appl. No.: 18/203,130

(22) Filed: May 30, 2023

(65) Prior Publication Data

US 2024/0079313 A1 Mar. 7, 2024

(30) Foreign Application Priority Data

Sep. 2, 2022 (KR) ........................ 10-2022-0111100

(51) Int. Cl.
H01L 23/498 (2006.01)
H01L 23/00 (2006.01)
(Continued)

(52) U.S. Cl.
CPC .... H01L 23/49866 (2013.01); H01L 23/3128 (2013.01); H01L 23/49811 (2013.01);
(Continued)

(58) Field of Classification Search
CPC ........... H01L 23/49866; H01L 23/3128; H01L 23/49811; H01L 23/49822;
(Continued)

(56) References Cited

U.S. PATENT DOCUMENTS 8,383,457 B2 2/2013 Pagaila et al.
9,601,461 B2 3/2017 Ho et al.
(Continued)

FOREIGN PATENT DOCUMENTS

KR 10-2011-0085481 A 7/2011
KR 10-2015-0109477 10/2015
(Continued)

OTHER PUBLICATIONS

Office Action dated Mar. 10, 2026 issued in corresponding to Korean Patent Application No. 10-2022-0111100.

*Primary Examiner* — Patricia D Valenzuela
(74) *Attorney, Agent, or Firm* — Morgan, Lewis & Bockius LLP

(57) ABSTRACT

A semiconductor package includes: a lower substrate including a lower wiring layer; an upper substrate disposed on the lower substrate and including an upper wiring layer and a cavity; an adhesive layer disposed in the cavity; a semiconductor chip having a first surface and a second surface opposite to the first surface, wherein connection pads are disposed on the first surface of the semiconductor chip and are electrically connected to the lower wiring layer, and wherein the second surface of the semiconductor chip is attached to the adhesive layer; a connection structure disposed between the lower substrate and the upper substrate and electrically connecting the lower wiring layer and the upper wiring layer; an encapsulant at least partially surrounding at least a portion of each of the semiconductor chip and the connection structure; and connection bumps electrically connected to the lower wiring layer.

19 Claims, 11 Drawing Sheets

(51) Int. Cl.
  *H01L 23/31* (2006.01)
  *H01L 25/065* (2023.01)
  *H01L 25/10* (2006.01)

(52) U.S. Cl.
  CPC .. *H01L 23/49822* (2013.01); *H01L 23/49838* (2013.01); *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 25/0657* (2013.01); *H01L 25/105* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/1312* (2013.01); *H01L 2224/13139* (2013.01); *H01L 2224/13147* (2013.01); *H01L 2224/16227* (2013.01); *H01L 2224/2919* (2013.01); *H01L 2224/32145* (2013.01); *H01L 2224/32225* (2013.01); *H01L 2224/48227* (2013.01); *H01L 2224/73215* (2013.01); *H01L 2224/73253* (2013.01); *H01L 2225/06506* (2013.01); *H01L 2225/0651* (2013.01); *H01L 2225/06562* (2013.01)

(58) Field of Classification Search
  CPC ... H01L 23/49838; H01L 24/13; H01L 24/16; H01L 24/29; H01L 24/32; H01L 24/48; H01L 24/73; H01L 25/0657; H01L 25/105; H01L 2224/13109; H01L 2224/13111; H01L 2224/13113; H01L 2224/13116; H01L 2224/13118; H01L 2224/1312; H01L 2224/13139; H01L 2224/13147; H01L 2224/16227; H01L 2224/2919; H01L 2224/32145; H01L 2224/32225; H01L 2224/48227; H01L 2224/73215; H01L 2224/73253; H01L 2225/06506; H01L 2225/0651; H01L 2225/06562; H01L 23/5385; H01L 2224/8385; H01L 2225/1011; H01L 2225/1023; H01L 2225/1041; H01L 2225/1058; H01L 23/13; H01L 24/81; H01L 24/92; H01L 25/50; H01L 23/49816; H01L 24/83; H01L 23/49833; H01L 23/3185; H01L 23/49894; H01L 24/15; H01L 2224/131
  See application file for complete search history.

(56) References Cited

U.S. PATENT DOCUMENTS

| | | | |
|---|---|---|---|
| 9,761,535 B1 | 9/2017 | Lin | |
| 10,510,703 B2 | 12/2019 | Chi et al. | |
| 11,164,754 B2 | 11/2021 | Tsai et al. | |
| 2014/0210106 A1 | 7/2014 | Zhai | |
| 2015/0221570 A1 | 8/2015 | Berry et al. | |
| 2016/0104668 A1 | 4/2016 | Lii et al. | |
| 2020/0105544 A1* | 4/2020 | Tsai | H01L 21/4853 |
| 2022/0037294 A1* | 2/2022 | Hwang | H01L 21/4853 |

FOREIGN PATENT DOCUMENTS

| | | |
|---|---|---|
| KR | 10-2016-0041814 | 4/2016 |
| KR | 10-1939046 B1 | 1/2019 |
| KR | 10-2020-0018867 A | 2/2020 |
| KR | 10-2020-0037066 A | 4/2020 |
| KR | 10-2021-0147453 A | 12/2021 |

* cited by examiner

SEMICONDUCTOR PACKAGE

CROSS-REFERENCE TO RELATED APPLICATION

This application claims priority under 35 U.S.C. § 119(a) to Korean Patent Application No. 10-2022-0111100 filed on Sep. 2, 2022 in the Korean Intellectual Property Office, the disclosure of which is incorporated by reference herein in its entirety.

TECHNICAL FIELD

The present inventive concept relates to a semiconductor package.

DISCUSSION OF THE RELATED ART

To provide electronic devices with high performance and miniaturization, a package on package (PoP) technology using interposer substrates has been under development. In some cases of a semiconductor package to which an interposer substrate is coupled, reliability and yield may be deteriorated because a heat treatment process may be repeated during a manufacturing process.

SUMMARY

According to an example embodiment of the present inventive concept, a semiconductor package includes: a lower substrate including a lower wiring layer; an upper substrate disposed on the lower substrate and including an upper wiring layer and a cavity that has a bottom surface facing the lower substrate; an adhesive layer disposed in the cavity; a semiconductor chip having a first surface and a second surface opposite to the first surface, wherein connection pads are disposed on the first surface of the semiconductor chip and are electrically connected to the lower wiring layer, and wherein the second surface of the semiconductor chip is attached to the adhesive layer; a connection structure disposed between the lower substrate and the upper substrate and electrically connecting the lower wiring layer and the upper wiring layer to each other; an encapsulant filling a gap between the semiconductor chip and the lower substrate and at least partially surrounding at least a portion of each of the semiconductor chip and the connection structure; and connection bumps disposed below the lower substrate and electrically connected to the lower wiring layer.

According to an example embodiment of the present inventive concept, a semiconductor package includes: a lower substrate including a lower wiring layer; an upper substrate disposed on the lower substrate and including an upper wiring layer and a protective layer that covers at least a portion of the upper wiring layer and that has a cavity facing the lower substrate; an adhesive layer attached within the cavity of the upper substrate; a semiconductor chip having a first surface and a second surface opposite to the first surface, wherein first connection pads are disposed on the first surface of the semiconductor chip, and wherein the second surface of the semiconductor chip is attached to the adhesive layer; and a connection structure disposed between the lower substrate and the upper substrate and electrically connecting the lower wiring layer and the upper wiring layer to each other.

According to an example embodiment of the present inventive concept, a semiconductor package includes: a lower substrate including a lower wiring layer; an upper substrate disposed on the lower substrate and including an upper wiring layer and a cavity that has a bottom surface facing the lower substrate; an adhesive layer disposed on the bottom surface of the cavity; a semiconductor chip having a first surface and a second surface opposite to the first surface, wherein connection pads are disposed on the first surface of the semiconductor chip, and wherein the second surface of the semiconductor chip is attached to the adhesive layer; a bump structure disposed below the semiconductor chip and electrically connecting the connection pads to the lower wiring layer; and a connection structure disposed between the lower substrate and the upper substrate and electrically connecting the lower wiring layer and the upper wiring layer to each other, wherein each of the bump structure and the connection structure includes a low melting point metal.

BRIEF DESCRIPTION OF DRAWINGS

The above and other aspects of the present inventive concept will become more apparent by describing in detail example embodiments thereof, with reference to the accompanying drawings, in which.

DETAILED DESCRIPTION OF THE EMBODIMENTS

Hereinafter, example embodiments of the present inventive concept will be described with reference to the accompanying drawings.

Figure 1A:
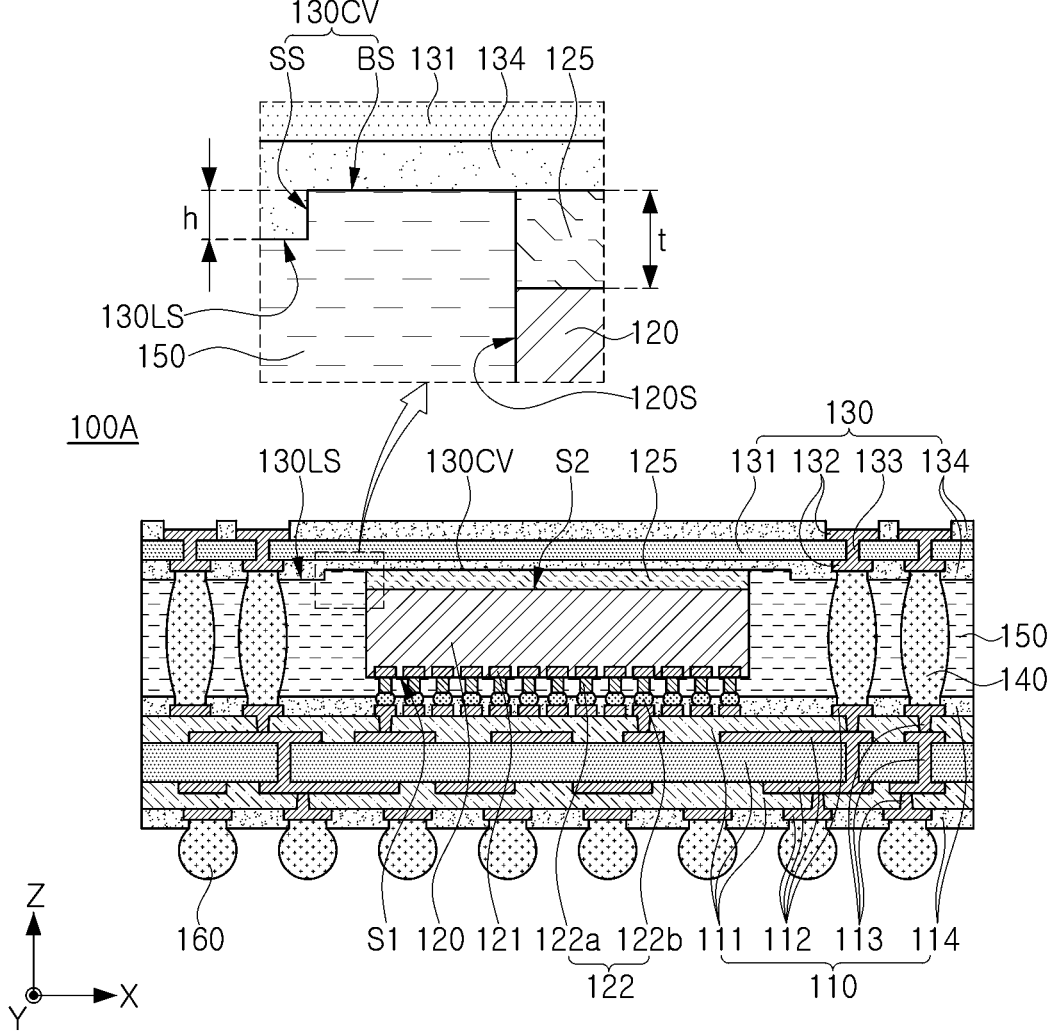
FIG. 1A is a cross-sectional view of a semiconductor package according to an example embodiment of the present inventive concept.
Figure 1B:
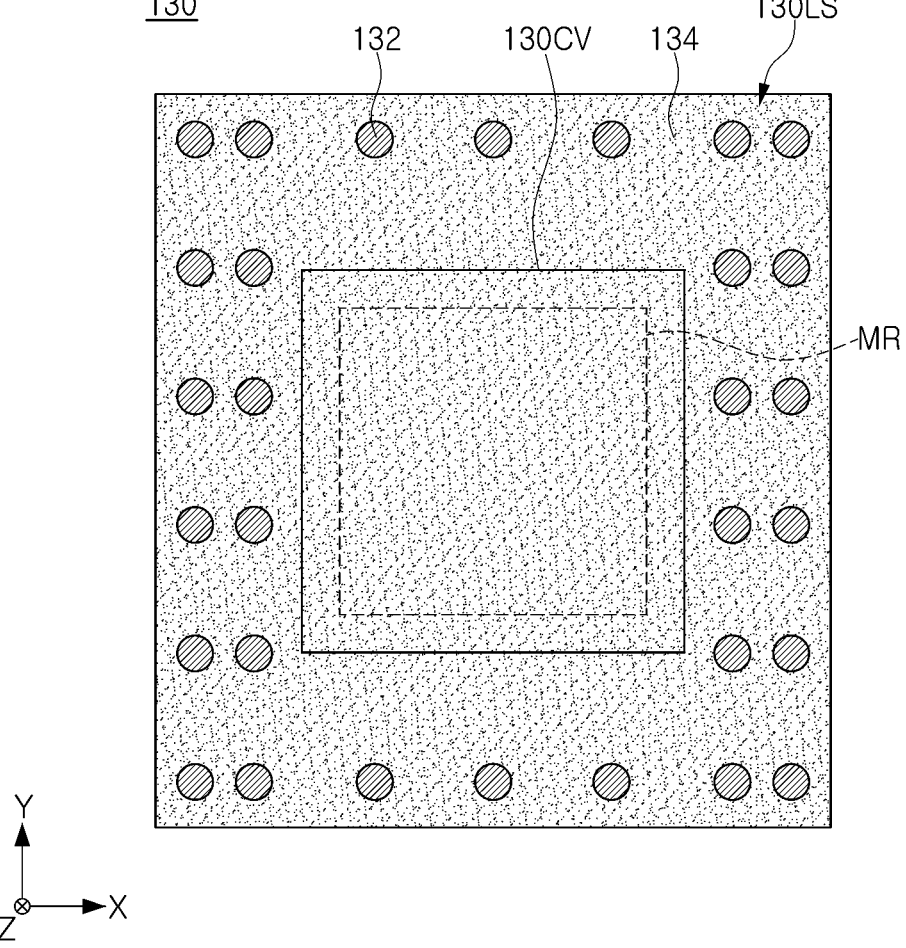
FIG. 1B is a bottom view of a lower surface of an upper substrate of FIG. 1A.

FIG. 1A is a cross-sectional view illustrating a semiconductor package 100A according to an example embodiment of the present inventive concept, and FIG. 1B is a bottom view illustrating a lower surface 130LS of an upper substrate 130 of FIG. 1A.

Referring to FIGS. 1A and 1B, a semiconductor package 100A according to an example embodiment of the present inventive concept may include a lower substrate 110, a semiconductor chip 120, an adhesive layer 125, an upper substrate 130, and a connection structure 140. In addition, the semiconductor package 100A may further include an encapsulant 150 and/or connection bumps 160.

The bump structure 122 and the connection structure 140 may include a relatively low melting point metal. When a heat treatment process (e.g., a thermal compression bonding process) for forming the connection structure 140 is performed after a heat treatment process (e.g., a reflow process) for forming the bump structure 122 is completed, defects, such as non-wetting and cracks, may occur in a solder portion (hereinafter, a second portion 122b) of the already formed bump structure 122. In an example embodiment of the present inventive concept, by attaching the semiconductor chip 120 to a lower portion of the upper substrate 130 by using the adhesive layer 125 that is attached to a cavity 130CV of the upper substrate 130, the heat treatment process (e.g., a reflow process) for mounting the semiconductor chip 120 and the heat treatment process (e.g., the thermal compression bonding process) for coupling the upper substrate 130 and the lower substrate 110 to each other may be simultaneously performed. Therefore, defects, such as non-wetting and cracks that may occur due to repetition of the heat treatment process may be prevented and reliability of the semiconductor package 100A may be increased. Hereinafter, each component will be described in detail with reference to the drawings.

The lower substrate 110 may be a support substrate on which the semiconductor chip 120 is mounted, and may be a package substrate including a lower wiring layer 112 for redistributing the semiconductor chip 120. A substrate for a package may include, for example, a printed circuit board (PCB), a ceramic substrate, a glass substrate, a tape wiring substrate, and the like. For example, the lower substrate 110 may include an insulating layer 111, the lower wiring layer 112, a lower wiring via 113, and a protective layer 114.

The insulating layer 111 may include an insulating resin. The insulating resin may include a thermosetting resin, such as an epoxy resin, a thermoplastic resin, such as polyimide, or a resin impregnated with inorganic fillers or/and glass fibers (glass fiber, glass cloth, glass fabric) in these resins. A resin impregnated with inorganic fillers or/and glass fibers may be, for example, prepreg, ABF, FR-4, BT, or a photo-sensitive resin, such as a photo-imagable dielectric (PID). The insulating layer 111 may include a plurality of insulating layers 111 stacked in a vertical direction (e.g., a Z-axis direction). Depending on the process, a boundary (or, e.g., an interface) between the plurality of insulating layers 111 might not be apparent. In addition, for convenience of description, only three insulating layers 111 are illustrated in the drawings, but the present inventive concept is not limited thereto. For example, a core insulating layer 111 located in the middle of the plurality of insulating layers 111 may be thicker than the insulating layers 111 stacked on and below the core insulating layer 111. The core insulating layer 111 may increase the rigidity of the substrate to suppress warpage of the substrate. The core insulating layer 111 may be formed using, for example, a copper clad Laminate (CCL), an unclad CCL, a glass substrate or a ceramic substrate. According to an embodiment of the present inventive concept, the lower substrate 110 might not include the core insulating layer 111. A protective layer 114 may be disposed on the uppermost insulating layer 111 and/or the lowermost insulating layer 111 of the plurality of insulating layers 111 to protect the lower wiring layer 112 from external physical/chemical damage. The protective layer 114 may be, for example, a solder resist layer. The solder resist layer may include an insulating material and may be formed using, for example, photo solder resist (PSR).

The lower wiring layer 112 may include a metal material, for example, copper (Cu), aluminum (Al), silver (Ag), tin (Sn), gold (Au), nickel (Ni), lead (Pb), titanium (Ti), or alloys thereof. The lower wiring layer 112 may include, for example, a ground (GND) pattern, a power (PoWeR) pattern, and a signal (S) pattern. The signal (S) pattern may provide a path through which various signals, for example, data signals, are transmitted/received. The lower wiring layer 112 may be provided as a plurality of lower wiring layers 112 respectively disposed on the plurality of insulating layers 111. The plurality of lower wiring layers 112 may be electrically connected to each other through a lower wiring via 113. The number of lower wiring layers 112 may be determined according to the number of insulating layers 111 and may include more or fewer layers than those illustrated in the drawing.

The lower wiring via 113 may be electrically connected to the lower wiring layer 112 and may include a signal via, a ground via, and a power via. The wiring via 113 may include a metal material, for example, copper (Cu), aluminum (Al), silver (Ag), tin (Sn), gold (Au), nickel (Ni), lead (Pb), titanium (Ti), or alloys thereof. The lower wiring via 113 may include a filled via, in which a metal material is filled in a via hole, or a conformal via, in which a metal material is formed along an inner wall of the via hole. For example, the lower wiring via 113 may be integrated with the lower wiring layer 112, but the present inventive concept is not limited thereto.

The semiconductor chip 120 may include, for example, silicon (Si), germanium (Ge), or gallium arsenide (GaAs), and various types of integrated circuits (ICs) may be formed. The IC may be, for example, a processor chip, such as a central processor (e.g., CPU), a graphics processor (e.g., GPU), a field programmable gate array (FPGA), an application processor (AP), a digital signal processor, a cryptographic processor, a microprocessor, a microcontroller, and the like, but the present inventive concept is not limited thereto. For example, the IC may be a logic chip, such as an analog-to-digital converter (ADC) and an ASIC, or a volatile memory (e.g., DRAM), and a non-volatile memory (e.g., ROM and flash memory).

The semiconductor chip 120 may have a first surface S1, on which the connection pads 121 are disposed, and a second surface S2 opposite to the first surface S1 and attached to the adhesive layer 125. The semiconductor chip 120 may be attached to the upper substrate 130 by the adhesive layer 125 and may be mounted on the lower substrate 110. The semiconductor chip 120 may be connected to the lower wiring layer 112 through the bump structure 122.

The bump structure 122 may be disposed below the semiconductor chip 120, and may electrically connect the connection pads 121 to the lower wiring layer 112. The bump structure 122 may include a first portion 122a, which contacts the connection pads 121, and a second portion 122b, which contacts the first portion 122a and the lower wiring layer 112. For example, the first portion 122a may be a metal post portion, and the second portion 122b may be a solder portion including a low melting point metal, but the present inventive concept is not limited thereto. For example, the first portion 122a may have a rectangular shape. According to some example embodiments of the present inventive concept, the bump structure 122 may include only the second portion 122b. The low melting point metal may include, for example, tin (Sn), indium (In), bismuth (Bi), antimony (Sb), copper (Cu), silver (Ag), zinc (Zn), lead (Pb), or alloys thereof (e.g., Sn—Ag—Cu).

The adhesive layer 125 may be disposed on a bottom surface BS of the cavity 130CV. For example, the adhesive layer 125 may directly contact the bottom surface BS of the cavity 130CV and the second surface S2 of the semiconductor chip 120. The adhesive layer 125 may include a thermosetting resin, a thermoplastic resin, or a mixture thereof. The adhesive layer 125 may include, for example, a die attach film (DAF) or a non-conductive film (NCF). According to an example embodiment of the present inventive concept, the adhesive layer 125 may include a thermal interface material (TIM). In an example embodiment of the present inventive concept, the adhesive layer 125 may have a predetermined thickness t. The thickness t of the adhesive layer 125 may be substantially equal to or greater than a height h (or, e.g., a depth) of the cavity 130CV. According to an example embodiment of the present inventive concept, the thickness t of the adhesive layer 125 may be less than the height h of the cavity 130CV (the example embodiment illustrated in FIG. 4). In addition, a width of the adhesive layer 125 may be substantially equal to or greater than a width of the semiconductor chip 120. For example, a width of the cavity 130 CV may be greater than or equal to each of a width of the adhesive layer 125 and a width of the semiconductor chip 120. A region MR in the cavity 130CV on which the adhesive layer 125 or the semiconductor chip 120 is mounted may be less than the area of the bottom surface BS, but the present inventive concept is not limited thereto.

The upper substrate 130 may be disposed on the lower substrate 110 and the semiconductor chip 120 to provide a redistribution layer on top of the semiconductor package 100A, and may be referred to as an interposer substrate located between the lower package and the upper package in a package on package structure. The upper substrate 130 may include an insulating layer 131, an upper wiring layer 132, wiring vias 133, and a protective layer 134. The insulating layer 131, the upper wiring layer 132, the wiring via 133, and the protective layer 134 respectively have characteristics the same as or similar to those of the insulating layer 111, the lower wiring layer 112, and the wiring via 113, and the protective layer 114 of the lower substrate 110 described above, and thus, a redundant description thereof may be omitted or briefly discussed.

The upper substrate 130 may include the cavity 130CV having the bottom surface BS that faces the lower substrate 110. The cavity 130CV may be formed in the protective layer 134 that provides the lower surface 130LS of the upper substrate 130. For example, the protective layer 134 may cover at least a portion of the upper wiring layer 132, and may provide the lower surface 130LS of the upper substrate 130 and a side surface SS and the bottom surface BS of the cavity 130CV. The bottom surface BS of the cavity 130CV may be disposed on a level higher than the lower surface 130LS of the upper substrate 130.

The height h of the cavity 130CV may be equal to or less than the thickness of the protective layer 134. According to an example embodiment of the present inventive concept, the height h of the cavity 130CV may be greater than a thickness of the protective layer 134, and the bottom surface BS of the cavity 130CV may be provided by the insulating layer 131. The height h of the cavity 130CV may correspond to a height h of the step between the bottom surface BS of the cavity 130CV and the lower surface 130LS of the upper substrate 130. For example, the height h of the cavity 130CV may correspond to the distance between the bottom surface BS of the cavity 130CV and the lower surface 130LS of the upper substrate 130. According to some example embodiments of the present inventive concept, since the cavity 130CV is introduced below the upper substrate 130, the thickness of the adhesive layer 125 may be sufficiently secured without reducing the thickness of the semiconductor chip 120. As a result, the semiconductor chip 120 may be stably supported on and fixed to the adhesive layer 125, and a gap between an active surface (hereinafter, the first surface S1) of the semiconductor chip 120 and the lower substrate 110 may be adjusted.

In an example embodiment of the present inventive concept, the thickness t of the adhesive layer 125 in the direction, substantially perpendicular to the bottom surface BS (e.g., the Z-direction) may be equal to or greater than the height h of the cavity 130CV. For example, the thickness t of the adhesive layer 125 may be in a range of about 10 μm to about 100 μm, about 30 μm to about 100 μm, about 50 μm to about 100 μm, about 50 μm to about 80 μm, and the height (h) of the cavity 130CV may be in the range of about 10 μm to about 50 μm, about 10 μm to about 40 μm, about 10 μm to about 30 μm, and about 20 μm to about 30 μm.

The connection structure 140 may be disposed between the lower substrate 110 and the upper substrate 130 and provide a vertical connection path electrically connecting the lower wiring layer 112 and the upper wiring layer 132 to each other. The connection structure 140 may have a spherical or ball shape formed of a low melting point metal such as tin (Sn), indium (In), bismuth (Bi), antimony (Sb), copper (Cu), silver (Ag), zinc (Zn), or lead (Pb), or alloys thereof (e.g., Sn—Ag—Cu).

The encapsulant 150 may fill a gap between the lower substrate 110 and the upper substrate 130 and seal at least a portion of each of the semiconductor chip 120 and the connection structure 140. For example, the encapsulant 150 may at least partially surround the semiconductor chip 120 and the connection structure 140. The encapsulant 150 may include, for example, a thermosetting resin, such as an epoxy resin, a thermoplastic resin, such as polyimide, or prepreg including an inorganic filler or/and glass fiber, ABF, FR-4, BT, or EMC. In an example embodiment of the present inventive concept, the encapsulant 150 may be formed using a molded underfill (MUF) method, but the present inventive concept is not limited thereto.

The connection bumps 160 may be disposed below the lower substrate 110 and electrically connected to the lower wiring layer 112. The connection bumps 160 may physically and/or electrically connect the semiconductor package 100A to an external device. The connection bumps 160 may include a conductive material and may have a ball, pin, or lead shape. For example, the connection bumps 160 may be solder balls. According to an example embodiment of the present inventive concept, passive elements, such as land-side capacitors (LSCs), die-side capacitors (DSCs), or embedded type capacitors, may be disposed on the lower substrate 110.

Figure 2:
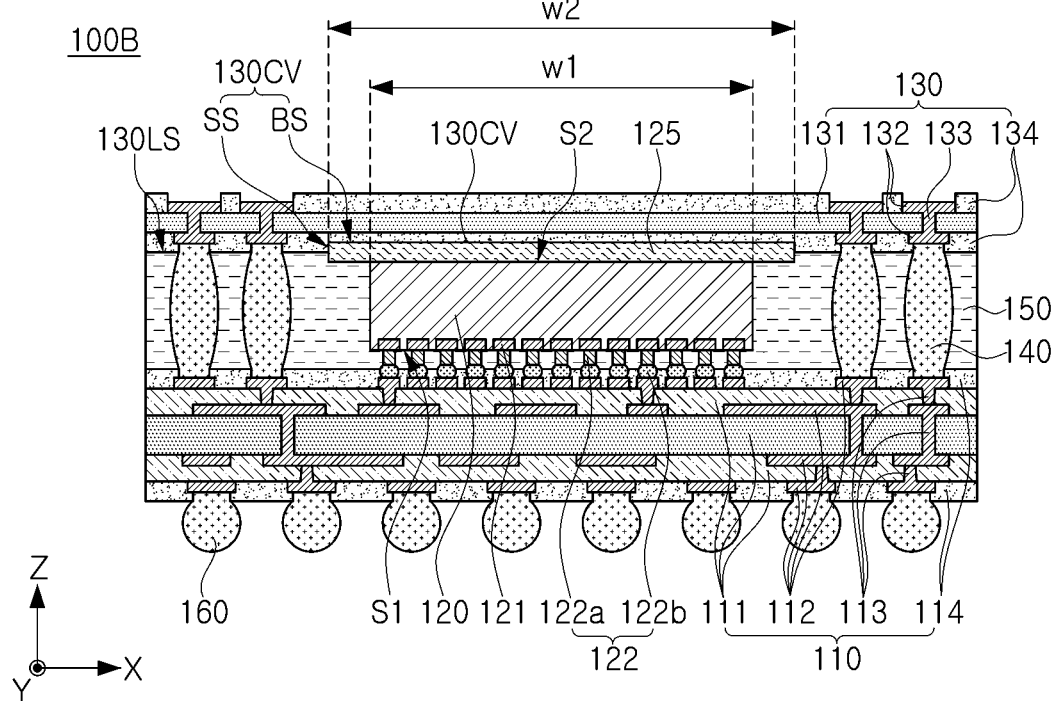
FIG. 2 is a cross-sectional view illustrating a semiconductor package according to an example embodiment of the present inventive concept.

FIG. 2 is a cross-sectional view illustrating a semiconductor package 100B according to an example embodiment of the present inventive concept.

Referring to FIG. 2, the semiconductor package 100B according to an example embodiment of the present inventive concept may have characteristics the same as or similar to those described above with reference to FIGS. 1A and 1B, except that a width w1 of the adhesive layer 125 is greater than a width w2 of the semiconductor chip 120. For example, the first width w1 of the adhesive layer 125 may be greater than the width w2 of the semiconductor chip 120 in a direction, parallel to the bottom surface BS of the cavity 130CV (e.g., the X-direction). In an example embodiment of the present inventive concept, the cavity 130CV may have the side surface SS surrounding the bottom surface BS, and the adhesive layer 125 may contact the side surface SS of the cavity 130CV. For example, the side surface SS is connected to the bottom surface BS. For example, the adhesive layer 25 may have a thickness greater than the height h of the cavity 130CV. According to an example embodiment of the present inventive concept, the adhesive layer 125 may extend to the lower surface 130LS of the upper substrate 130 or might not contact the side surface SS of the cavity 130CV. As such, the width w1 of the adhesive layer 125 is not particularly limited, but may be formed to contact the side surface SS of the cavity 130CV in consideration of the filling properties of the encapsulant 150.

Figure 3:
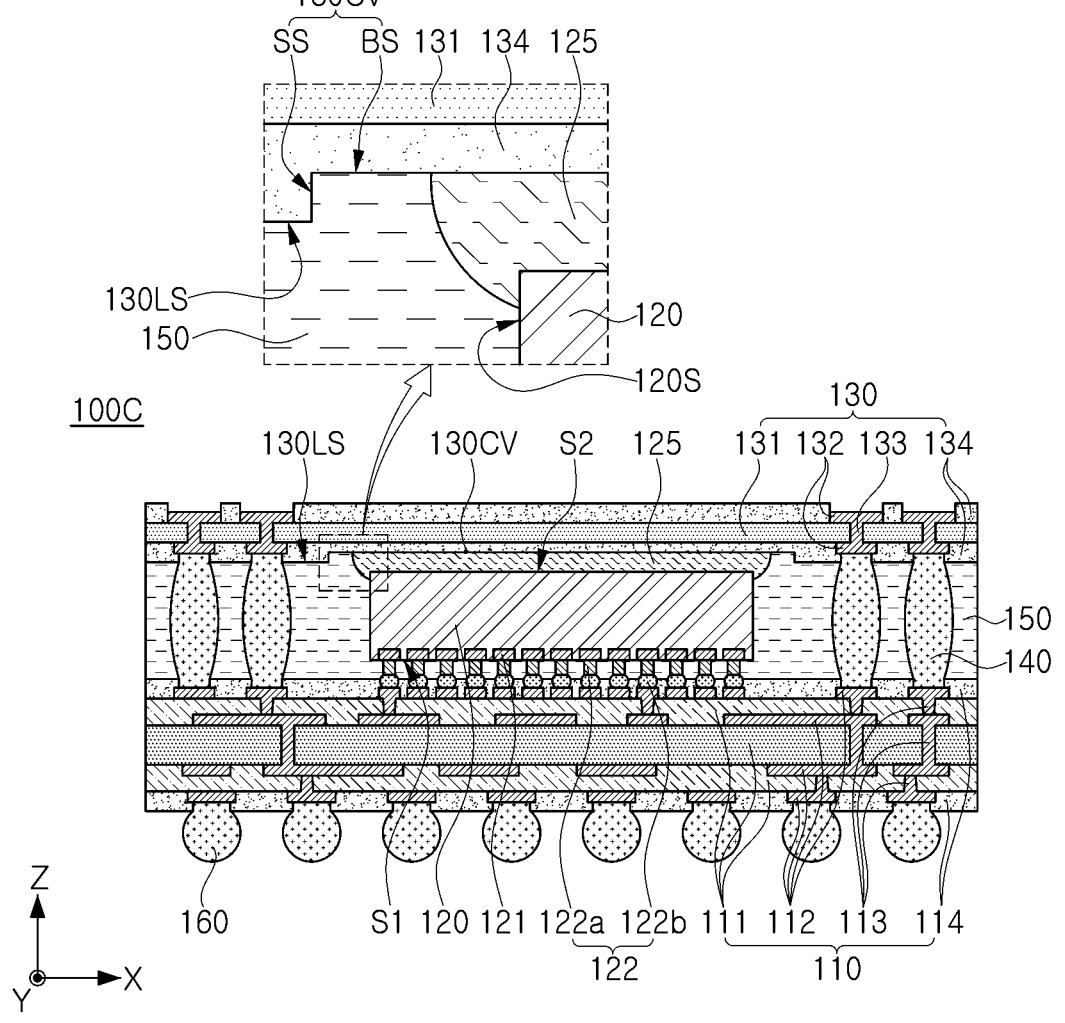
FIG. 3 is a cross-sectional view illustrating a semiconductor package according to an example embodiment of the present inventive concept.

FIG. 3 is a cross-sectional view illustrating a semiconductor package 100C according to an example embodiment of the present inventive concept.

Referring to FIG. 3, the semiconductor package 100C of an example embodiment of the present inventive concept may have characteristics the same as or similar to those described above with reference to FIGS. 1A to 2, except that the adhesive layer 125 extends to a side surface 120S of the semiconductor chip 120. The semiconductor chip 120 may have the side surface 120S between the first surface S1 and the second surface S2 of the semiconductor chip 120, and the adhesive layer 125 may contact at least a portion of the side surface 120S of the semiconductor chip 120. The adhesive layer 125 may extend to the side surface 120S of the semiconductor chip 120 in the process of attaching the semiconductor chip 120 to the cavity 130CV of the upper substrate 130 (refer to FIG. 9B) or in the process of forming the bump structure 122 and the connection structure 140 (refer to FIG. 9D).

Figure 4:
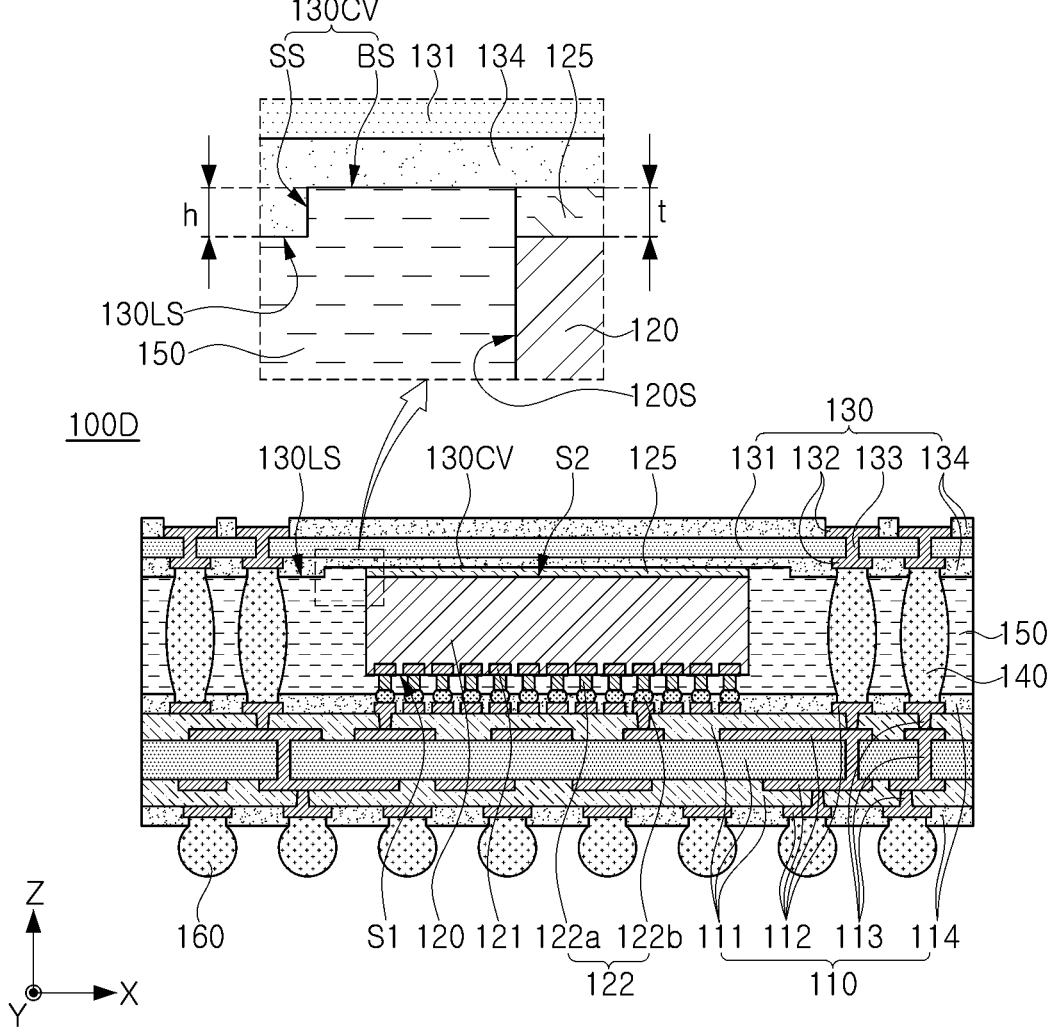
FIG. 4 is a cross-sectional view illustrating a semiconductor package according to an example embodiment of the present inventive concept.

FIG. 4 is a cross-sectional view illustrating a semiconductor package 100D according to an example embodiment of the present inventive concept.

Referring to FIG. 4, the semiconductor package 100D according to an example embodiment of the present inventive concept may have characteristics the same as or similar to those described above with reference to FIGS. 1A to 3, except that the thickness t of the adhesive layer 125 is equal to or smaller than the height h of the cavity 130CV. According to an example embodiment of the present inventive concept, while the thickness t of the adhesive layer 125 decreases, the thickness of the semiconductor chip 120 may increase. As the thickness of the semiconductor chip 120 increases, thermal resistance (° C./W) characteristics of the semiconductor chip 120 may be improved. In this manner, an overall thickness of the semiconductor package 100D and a gap between the semiconductor chip 120 and the lower substrate 110 may be adjusted by adjusting the thickness of the adhesive layer 125 and the semiconductor chip 120.

Figure 5:
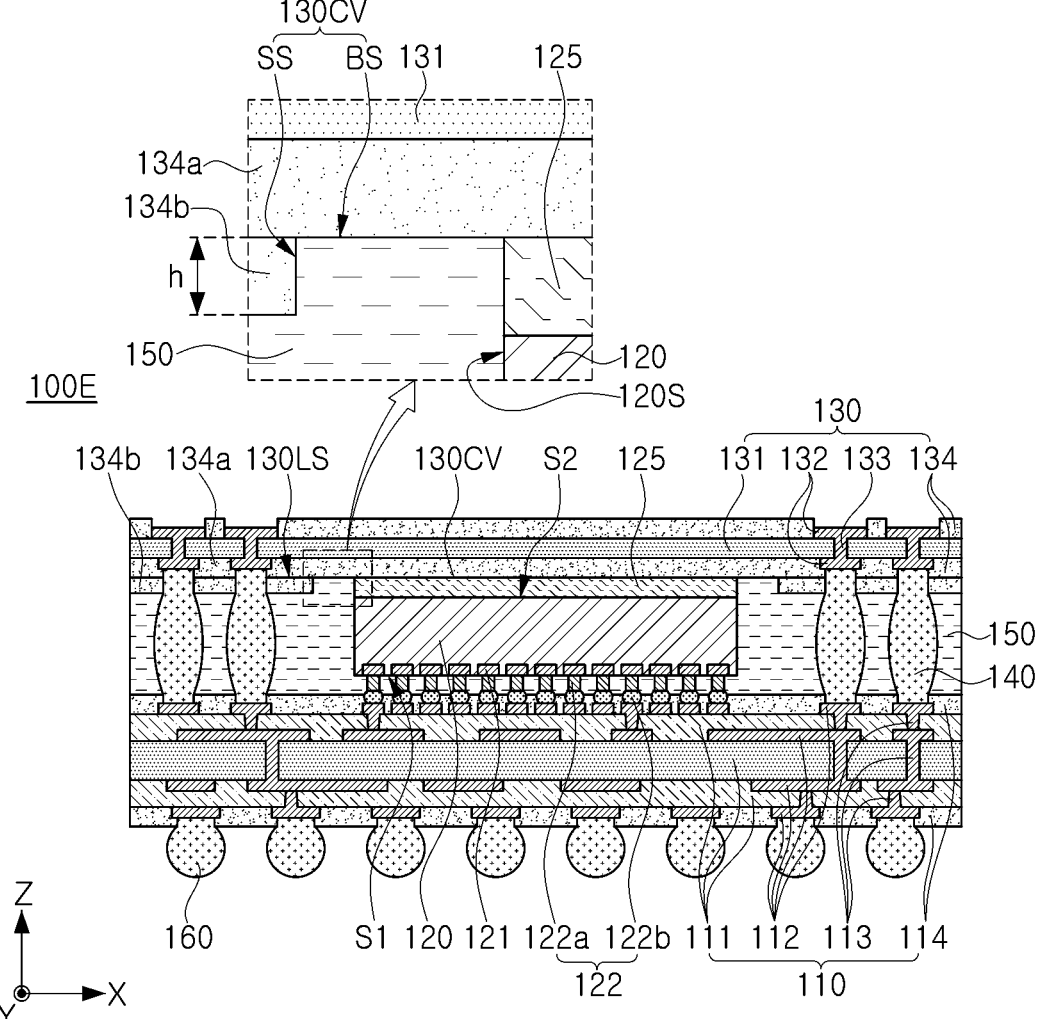
FIG. 5 is a cross-sectional view illustrating a semiconductor package according to an example embodiment of the present inventive concept.

FIG. 5 is a cross-sectional view illustrating a semiconductor package 100E according to an example embodiment of the present inventive concept.

Referring to FIG. 5, the semiconductor package 100E according to an example embodiment of the present inventive concept may have characteristics the same as or similar to those described above with reference to FIGS. 1A to 4, except that the semiconductor package 100E includes a first protective layer 134a and a second protective layer 134b. The protective layer 134 disposed below the upper substrate 130 may include a first protective layer 134a, which is in contact with the upper wiring layer 132, and a second protective layer 134b, which is disposed below the first protective layer 134a and provides the side surface SS of the cavity 130CV. The height h of the cavity 130CV may be the same as a thickness of the second protective layer 134b. For example, the bottom surface BS of the cavity 130CV may be defined by the first protective layer 134a, and the side surface SS of the cavity 130CV may be defined by the second protective layer 134b. According to an example embodiment of the present inventive concept, the height h of the cavity 130CV may be less than or greater than the thickness of the second protective layer 134b. In this manner, by introducing the second protective layer 134b, the height h of the cavity 130CV may be more easily adjusted and the thickness of the adhesive layer 125 and the semiconductor chip 120 may be secured.

Figure 6:
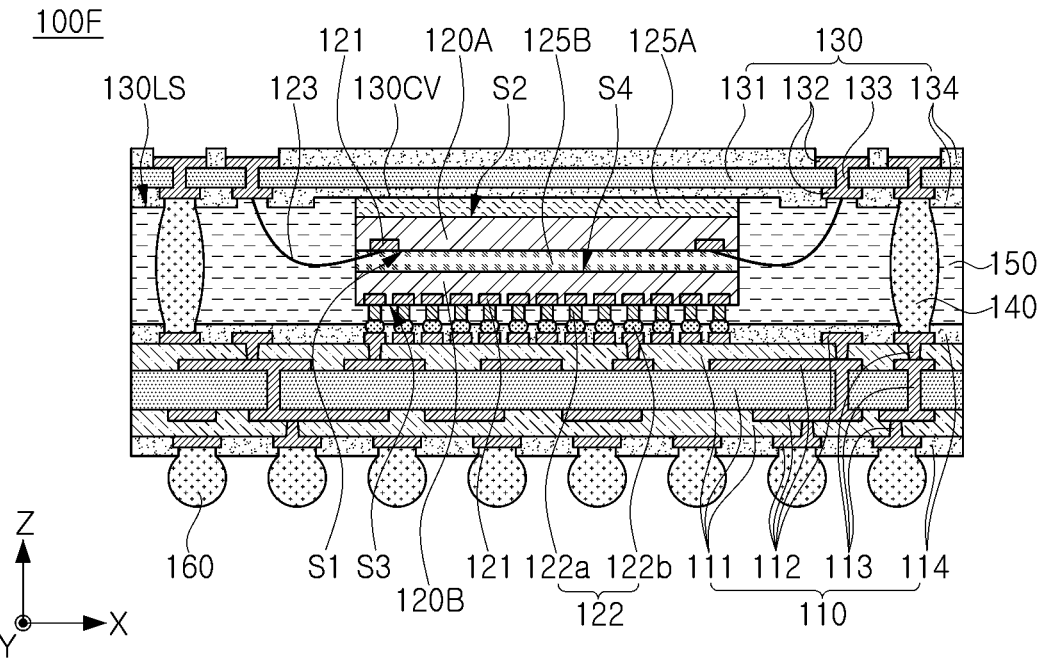
FIG. 6 is a cross-sectional view illustrating a semiconductor package according to an example embodiment of the present inventive concept.

FIG. 6 is a cross-sectional view illustrating a semiconductor package 100F according to an example embodiment of the present inventive concept.

Referring to FIG. 6, the semiconductor package 100F according to an example embodiment of the present inventive concept may have characteristics the same as or similar to those described above with reference to FIGS. 1A to 5, except that the semiconductor package 100F includes a plurality of semiconductor chips 120A and 120B. The semiconductor package 100F may include a first semiconductor chip 120A and a second semiconductor chip 120B. The first semiconductor chip 120A and the second semiconductor chip 120B may include different types of ICs from each other, but the present inventive concept is not limited thereto. For example, the first semiconductor chip 120A may include an AP chip, and the second semiconductor chip 120B may include a power management IC (PMIC) chip.

The semiconductor package 100F may include a first adhesive layer 125A, the first semiconductor chip 120A, a second adhesive layer 125B (or, e.g., a 'lower adhesive layer'), and the second semiconductor chip 120B (or, e.g., a 'lower semiconductor chip'). The second adhesive layer 125B may be disposed on the first surface S1 of the first semiconductor chip 120A and cover the first connection pads 121. The second semiconductor chip 120B may have a third surface S3, on which the second connection pads 121 are disposed, and a fourth surface S4 attached to the lower adhesive layer 125B. In an example embodiment of the present inventive concept, the first connection pads 121 of the first semiconductor chip 120A may be electrically connected to the upper wiring layer 132 by a wire structure 123, and the second connection pads 121 of the second semiconductor chip 120B may be electrically connected to the lower wiring layer 112 by the bump structure 122. The bump structure 122 may include a first portion 122a, which contacts the second connection pads 121, and a second portion 122b, which contacts the first portion 122a and the lower wiring layer 112. The second portion 122b may be, for example, a solder portion including a low melting point metal.

Figure 7:
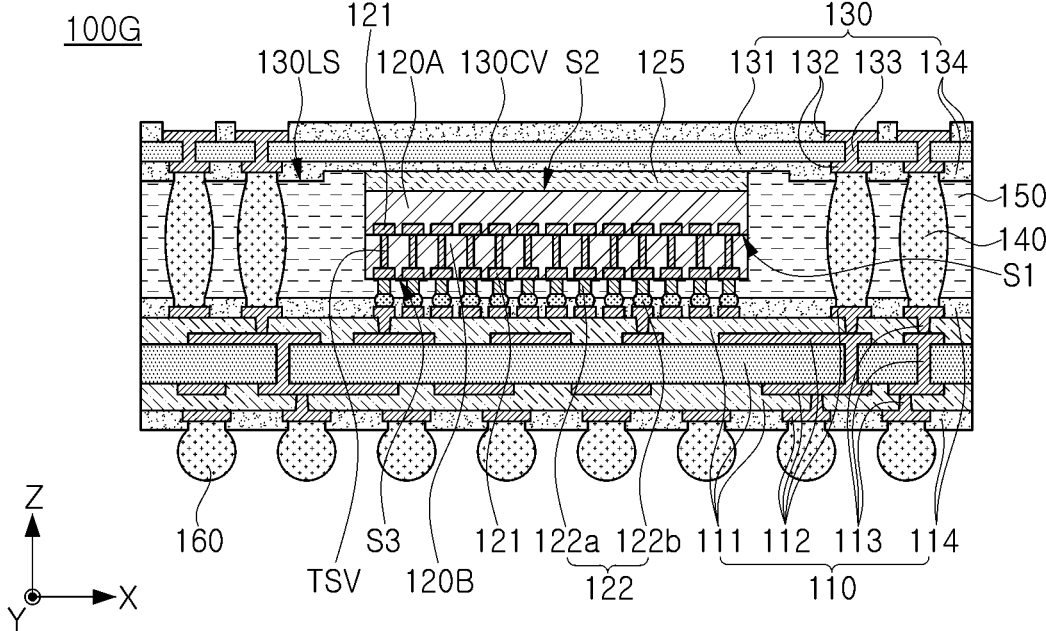
FIG. 7 is a cross-sectional view illustrating a semiconductor package according to an example embodiment of the present inventive concept.

FIG. 7 is a cross-sectional view illustrating a semiconductor package 100G according to an example embodiment of the present inventive concept.

Referring to FIG. 7, the semiconductor package 100G according to an example embodiment of the present inventive concept may have characteristics the same as or similar to those described above with reference to FIGS. 1A to 6, except that the semiconductor package 100G includes a plurality of semiconductor chips 120A and 120B connected to each other through through-vias (TSVs). The semiconductor package 100G may include a first semiconductor chip 120A and a second semiconductor chip 120B. The first semiconductor chip 120A and the second semiconductor chip 120B may include different types of ICs from each other, but the present inventive concept is not limited thereto.

The semiconductor package 100G may include an adhesive layer 125, a first semiconductor chip 120A, and a second semiconductor chip 120B (or, e.g., a 'lower semiconductor chip'). The second semiconductor chip 120B may include second connection pads 121 and through-vias TSV. In an example embodiment of the present inventive concept, the first connection pads 121 of the first semiconductor chip 120A may electrically connect the first semiconductor chip 120A to the lower substrate 110 through the through vias TSV of the second semiconductor chip 120B. The second connection pads 121 of the second semiconductor chip 120B may be electrically connected to the lower wiring layer 112 by the bump structure 122.

Figure 8:
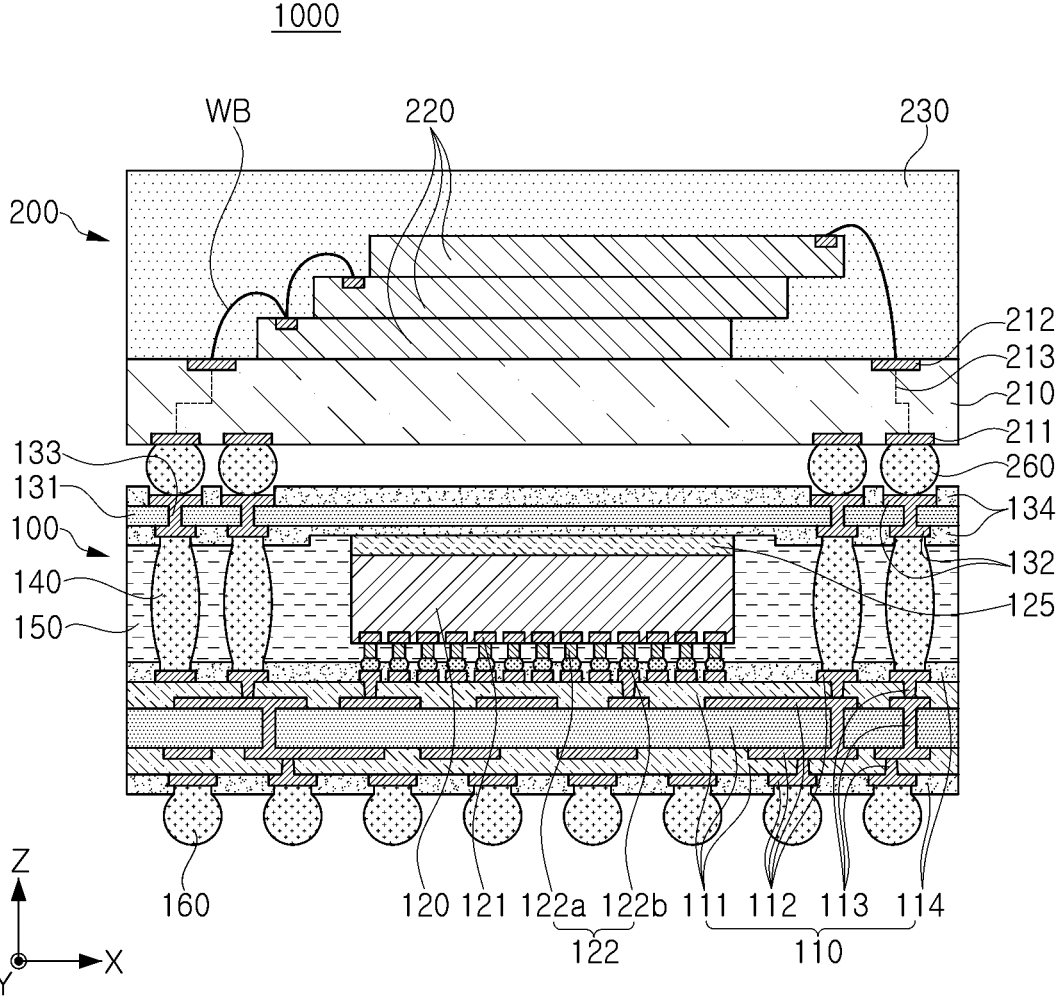
FIG. 8 is a cross-sectional view illustrating a semiconductor package according to an example embodiment of the present inventive concept.

FIG. 8 is a cross-sectional view illustrating a semiconductor package 1000 according to an example embodiment of the present inventive concept.

Referring to FIG. 8, the semiconductor package 1000 according to an example embodiment of the present inventive concept may include a first package 100 and a second package 200. Although the first package 100 is illustrated to be the same as the semiconductor package 100A illustrated in FIG. 1A, the first package 100 may be understood as having characteristics the same as or similar to those of the semiconductor packages 100A, 100B, 100C, 100D, 100E, 100F, and 100G described above with reference to FIGS. 1A to 7.

The second package 200 may include a wiring substrate 210, a semiconductor chip 220, and a molding layer 230. The wiring substrate 210 may include a lower pad 211 and an upper pad 212 on the lower and upper surfaces, respectively. In addition, the wiring substrate 210 may include a wiring circuit 213 electrically connecting the lower pad 211 and the upper pad 212 to each other.

The semiconductor chip 220 may be mounted on the wiring substrate 210 by wire bonding or flip chip bonding. For example, the plurality of semiconductor chips 220 may be vertically stacked on the wiring substrate 210 and electrically connected to the upper pad 212 of the wiring substrate 210 by a bonding wire WB. In an example, the semiconductor chip 220 of the second package 200 may include a memory chip, and the semiconductor chip 120 of the first package 100 may include an AP chip.

The molding layer 230 may include a material the same as or similar to that of the encapsulant 150 of the first package 100. The second package 200 may be physically and electrically connected to the first package 100 by a metal bump 260. The metal bump 260 may be electrically connected to the wiring circuit 213 through the lower pad 211 of the wiring substrate 210. The metal bump 260 may include a low melting point metal, for example, tin (Sn) or an alloy containing tin (Sn).

FIGS. 9A to 9E are cross-sectional views schematically illustrating a manufacturing process of a semiconductor package according to an example embodiment of the present inventive concept. In FIGS. 9A to 9E, the lower substrate 110 and the upper substrate 130 are illustrated by units for convenience of explanation, but the manufacturing process described below may be performed in units of strip substrates, block substrates, etc. including a plurality of unit substrates.

Figure 9A:
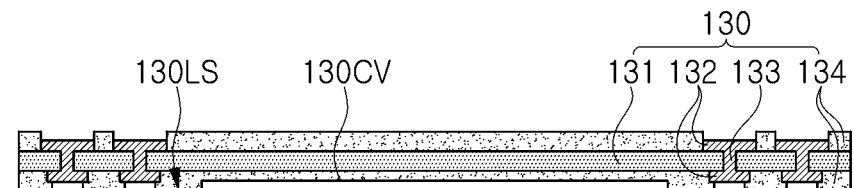
FIGS. 9A, 9B, 9C, 9D, and 9E are cross-sectional views schematically illustrating a manufacturing process of a semiconductor package according to an example embodiment of the present inventive concept.
Figure 9A:
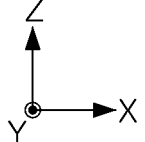

Referring to FIG. 9A, the upper substrate 130 including the insulating layer 131, the upper wiring layer 132, the wiring vias 133, and the protective layer 134 may be prepared. The upper substrate 130 may include the cavity 130CV formed on one surface of the protective layer 134. The cavity 130CV may be formed by patterning the protective layer 134. The protective layer 134 may be patterned by applying solder resist ink (e.g., PSR ink) and performing an exposure process and a development process. The upper substrate 130 may have the lower surface 130 LS provided by the protective layer 134.

Figure 9B:
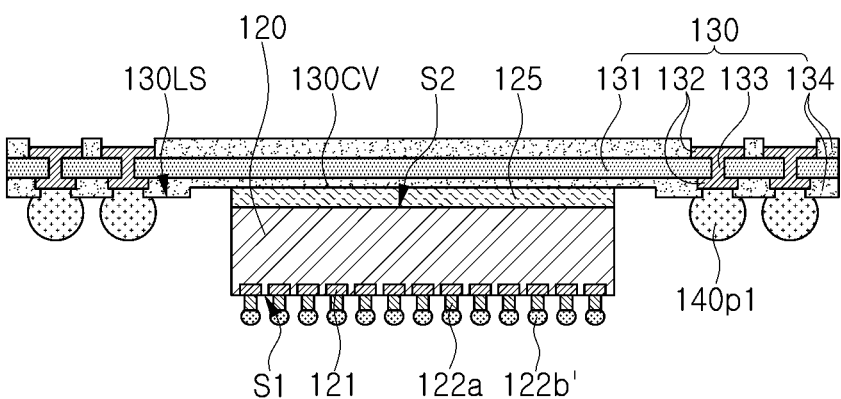

Referring to FIG. 9B, the adhesive layer 125 and the semiconductor chip 120 may be attached to a lower portion of the upper substrate 130. The adhesive layer 125 may be thicker than the height of the cavity 130CV, but the present inventive concept is not limited thereto. The semiconductor chip 120 may be disposed on the adhesive layer 125 such that the second surface S2 of the semiconductor chip 120 is in contact with the adhesive layer 125. A preliminary bump structure having a pillar portion 122a and a preliminary solder portion 122b' may be disposed on the connection pads 121 of the semiconductor chip 120. For example, the preliminary solder portion 122b' may be a solder ball.

In addition, a first preliminary connection structure 140p1 may be disposed below the upper substrate 130. The first preliminary connection structure 140p1 may have a spherical or ball shape formed of a low melting point metal, such as tin (Sn), indium (In), bismuth (Bi), antimony (Sb), copper (Cu), silver (Ag), zinc (Zn), lead (Pb) or alloys thereof (e.g., Sn—Ag—Cu).

Figure 9C:
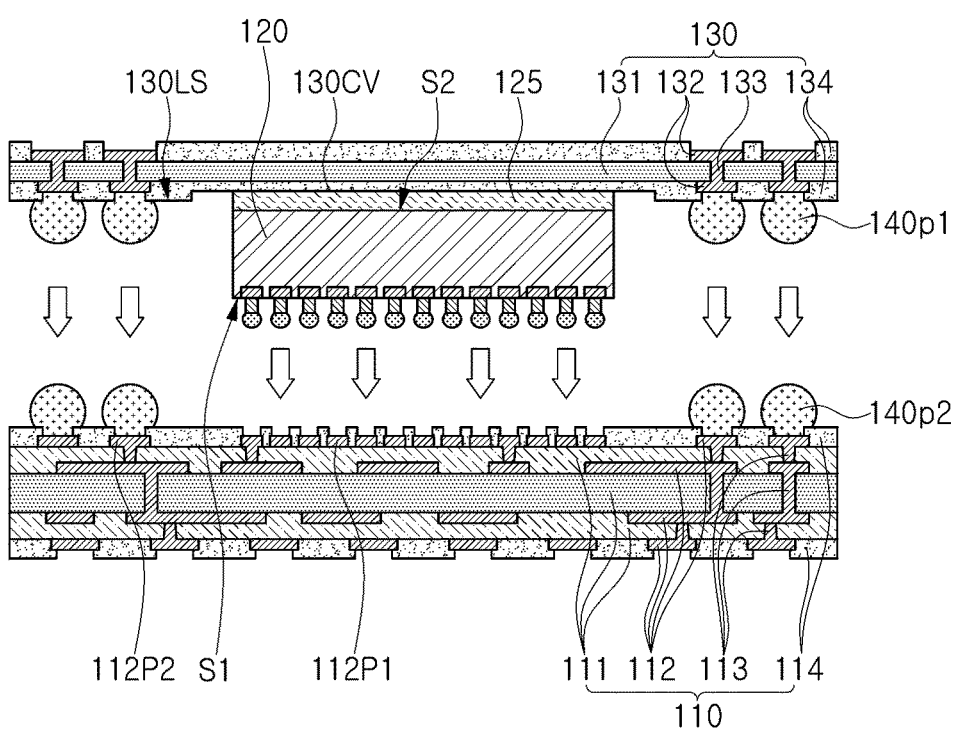

Referring to FIG. 9C, the lower substrate 110, on which a second preliminary connection structure 140p2 is disposed, may be prepared. The lower substrate 110 may include the insulating layer 111, the lower wiring layer 112, the wiring via 113, and the protective layer 114. The protective layer 114 may have openings exposing a first pad 112P1 and a second pad 112P2 of the lower wiring layer 112. The second preliminary connection structure 140p2 may be connected to the second pad 112P2 of the lower wiring layer 112 and may have a spherical or ball shape formed of a low melting point metal, similar to the first preliminary connection structure 140p1.

In the upper substrate 130, the first preliminary connection structure 140p1 and the preliminary bump structures may be aligned on the lower substrate 110 to respectively overlap the second preliminary connection structure 140p2 and the first pads 112P1 of the lower substrate 110 in a vertical direction (e.g., the Z-axis direction). A flux layer may be coated on surfaces of the first preliminary connection structure 140p1 and the second preliminary connection structure 140p2.

Figure 9D:
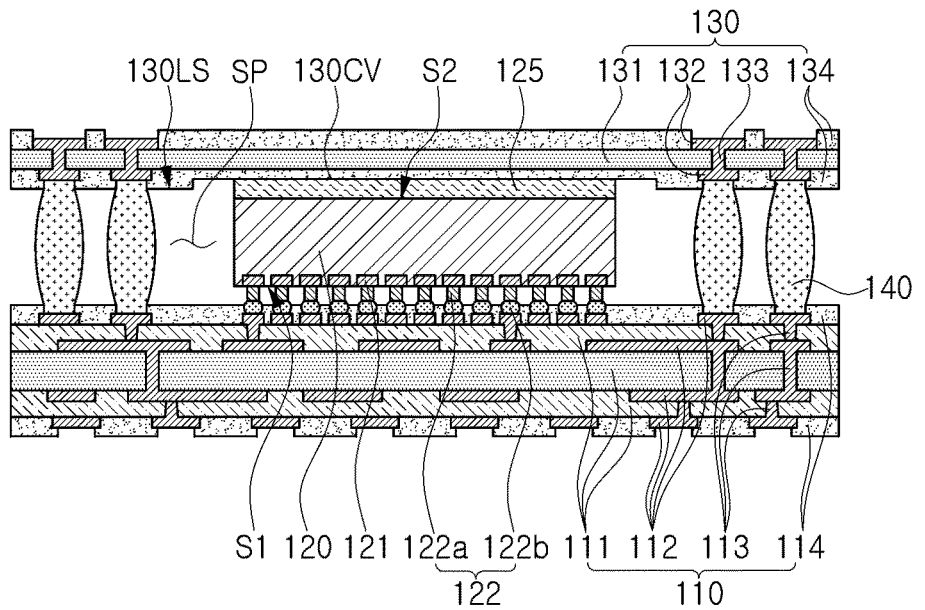

Referring to FIG. 9D, the connection structure 140 and the bump structures 122 may be formed by performing a thermal compression bonding process. The connection structure 140 may be formed by melting and fusing the first preliminary connection structure 140p1 and the second preliminary connection structure 140p2 with each other. The solder portions 122b of the bump structures 122 may be formed by melting the preliminary solder portions 122b'.

As described above, the heat treatment process for mounting the semiconductor chip 120 (e.g., a reflow process) and the heat treatment process for bonding the upper substrate 130 and the lower substrate 110 to each other (e.g., a thermal compression bonding process) are performed simultaneously, so that defects, such as non-wetting and cracks occurring in the process of forming the bump structures 122 and/or the connection structure 140 may be prevented. Thereafter, flux residues may be removed by injecting a cleaning solution (e.g., purified water) into a remaining space SP between the lower substrate 110 and the upper substrate 130.

Figure 9E:
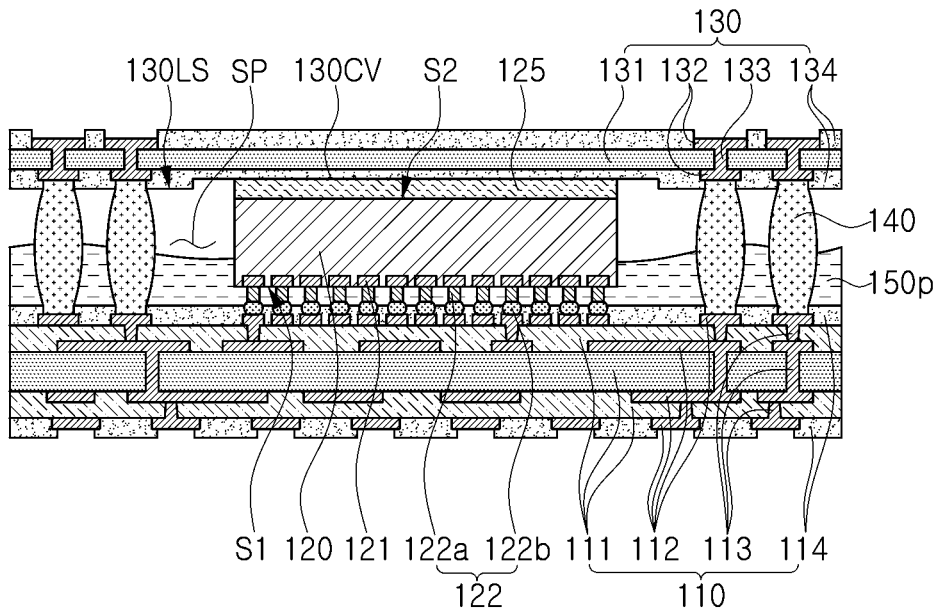

Referring to FIG. 9E, a space between the lower substrate 110 and the upper substrate 130 may be filled with an encapsulant material 150*p*. The encapsulant material 150*p* may be formed to fill the inside of the cavity 130CV of the upper substrate 130. For example, the encapsulant material 150*p* may fill space of the cavity 130CV that is not occupied by the adhesive layer 125. Thereafter, connection bumps may be formed below the lower substrate 110, and the strip substrate may be cut into package units to form the semiconductor package.

According to some example embodiments of the present inventive concept, a semiconductor package may have increased reliability by introducing an adhesive layer between a semiconductor chip and an upper substrate.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor package comprising:
a lower substrate including a lower wiring layer;
an upper substrate disposed on the lower substrate and including an upper wiring layer and a cavity that has a bottom surface facing the lower substrate;
an adhesive layer disposed in the cavity;
a semiconductor chip having a first surface and a second surface opposite to the first surface, wherein first connection pads are disposed on the first surface of the semiconductor chip and are electrically connected to the upper wiring layer, and wherein the second surface of the semiconductor chip is attached to the adhesive layer;
a lower adhesive layer attached to the first surface of the semiconductor chip;
a lower semiconductor chip having a third surface and a fourth surface opposite the third surface, wherein second connection pads are disposed on the third surface of the lower semiconductor chip and are electrically connected to the lower wiring layer, and wherein the fourth surface is attached to the lower adhesive layer;
a connection structure disposed between the lower substrate and the upper substrate and electrically connecting the lower wiring layer and the upper wiring layer to each other;
an encapsulant filling a gap between the lower semiconductor chip and the lower substrate and at least partially surrounding at least a portion of each of the semiconductor chip, the lower semiconductor chip, and the connection structure; and
connection bumps disposed below the lower substrate and electrically connected to the lower wiring layer.

2. The semiconductor package of claim 1, wherein the adhesive layer is in direct contact with the bottom surface of the cavity and the second surface of the semiconductor chip.

3. The semiconductor package of claim 1, wherein
the upper substrate has a lower surface positioned at a level lower than a level of the bottom surface of the cavity, wherein a distance between the lower surface of the upper substrate and the bottom surface of the cavity corresponds to a height of the cavity, and
a thickness of the adhesive layer in a direction, substantially perpendicular to the bottom surface, is equal to or greater than the height of the cavity.

4. The semiconductor package of claim 3, wherein the thickness of the adhesive layer is in a range of about 10 μm to about 100 μm.

5. The semiconductor package of claim 3, wherein a height of the cavity is in a range of about 10 μm to about 50 μm.

6. The semiconductor package of claim 1, wherein a first width of the adhesive layer in a direction, parallel to the bottom surface of the cavity, is equal to or greater than a second width of the semiconductor chip.

7. The semiconductor package of claim 1, wherein the cavity has a side surface connected to the bottom surface of the cavity, and the adhesive layer is in contact with the side surface of the cavity.

8. The semiconductor package of claim 1, wherein
the semiconductor chip has a side surface between the first surface and the second surface, and
the adhesive layer is in contact with at least a portion of the side surface of the semiconductor chip.

9. The semiconductor package of claim 1, wherein the adhesive layer includes a thermosetting resin, a thermoplastic resin, or a mixture thereof.

10. The semiconductor package of claim 1, wherein the lower semiconductor chip is connected to the lower wiring layer of the lower substrate through a bump structure.

11. The semiconductor package of claim 10, wherein each of the connection structure and the bump structure includes tin (Sn), indium (In), bismuth (Bi), antimony (Sb), copper (Cu), silver (Ag), zinc (Zn), lead (Pb), or alloys thereof.

12. A semiconductor package comprising:
a lower substrate including a lower wiring layer;
an upper substrate disposed on the lower substrate and including an upper wiring layer and a protective layer that covers at least a portion of the upper wiring layer and that has a cavity facing the lower substrate;
an adhesive layer attached within the cavity of the upper substrate;
a semiconductor chip having a first surface and a second surface opposite to the first surface, wherein first connection pads are disposed on the first surface of the semiconductor chip and are electrically connected to the upper wiring layer, and wherein the second surface of the semiconductor chip is attached to the adhesive layer;
a lower adhesive layer attached to the first surface of the semiconductor chip;
a lower semiconductor chip having a third surface and a fourth surface opposite the third surface, wherein second connection pads are disposed on the third surface of the lower semiconductor chip and are electrically connected to the lower wiring layer, and wherein the fourth surface is attached to the lower adhesive layer; and
a connection structure disposed between the lower substrate and the upper substrate and electrically connecting the lower wiring layer and the upper wiring layer to each other.

13. The semiconductor package of claim 12, wherein the protective layer provides a lower surface of the upper substrate and a bottom surface of the cavity.

14. The semiconductor package of claim 13, wherein the bottom surface of the cavity is located on a level higher than a level of the lower surface of the upper substrate.

15. The semiconductor package of claim 12, wherein a height of the cavity is equal to or less than a thickness of the protective layer.

16. The semiconductor package of claim 12, wherein the protective layer includes a first protective layer and a second protective layer, wherein the first protective layer is disposed on the upper wiring layer, and wherein the second protective layer is disposed below the first protective layer and provides a side surface of the cavity.

17. The semiconductor package of claim 12, wherein the first connection pads of the semiconductor chip are connected to the upper wiring layer by a wire structure, and the second connection pads of the lower semiconductor chip are connected to the lower wiring layer by a bump structure.

18. A semiconductor package comprising:

a lower substrate including a lower wiring layer;

an upper substrate disposed on the lower substrate and including an upper wiring layer and a cavity that has a bottom surface facing the lower substrate;

an adhesive layer disposed on the bottom surface of the cavity;

a semiconductor chip having a first surface and a second surface opposite to the first surface, wherein first connection pads are disposed on the first surface of the semiconductor chip and are electrically connected to the upper wiring layer, and wherein the second surface of the semiconductor chip is attached to the adhesive layer;

a lower adhesive layer attached to the first surface of the semiconductor chip;

a lower semiconductor chip having a third surface and a fourth surface opposite to the third surface, wherein second connection pads are disposed on the third surface of the lower semiconductor chip and are electrically connected to the lower wiring layer, and wherein the fourth surface is attached to the lower adhesive layer;

a bump structure disposed below the lower semiconductor chip and electrically connecting the second connection pads to the lower wiring layer; and a connection structure disposed between the lower substrate and the upper substrate and electrically connecting the lower wiring layer and the upper wiring layer to each other, wherein each of the bump structure and the connection structure includes a low melting point metal.

19. The semiconductor package of claim 18, wherein the low melting point metal includes tin (Sn), indium (In), bismuth (Bi), antimony (Sb), copper (Cu), silver (Ag), zinc (Zn), lead (Pb), or alloys thereof.

* * * * *